United States Patent [19]

Matrone

[11] 4,321,533
[45] Mar. 23, 1982

[54] PRINTED CIRCUIT BOARD TEST FIXTURE HAVING INTERCHANGEABLE CARD PERSONALIZERS

[75] Inventor: John L. Matrone, Guilderland, N.Y.

[73] Assignee: Fairchild Camera & Instrument Corp., Mountain View, Calif.

[21] Appl. No.: 213,708

[22] Filed: Dec. 8, 1980

Related U.S. Application Data

[63] Continuation of Ser. No. 31,432, Apr. 19, 1979, abandoned.

[51] Int. Cl.³ ............... G01R 31/02; G01R 31/22
[52] U.S. Cl. ............... 324/158 F; 324/73 PC; 324/158 P
[58] Field of Search ............ 324/158 F, 158 P, 73 PC

[56] References Cited

U.S. PATENT DOCUMENTS

| | | |
|---|---|---|
| 3,176,091 | 3/1965 | Hanson et al. |
| 3,564,408 | 2/1971 | Schulz et al. |
| 4,017,793 | 4/1977 | Haines ............ 324/78 PC |
| 4,108,528 | 8/1978 | Long et al. |
| 4,164,704 | 8/1979 | Kato et al. ............ 324/158 F X |
| 4,183,609 | 1/1980 | Luna ............ 324/158 F X |

OTHER PUBLICATIONS

Beckman, Circuit Board Test Fixture, Western Electric Technical Digest No. 43, Jul. 1976, pp. 5 & 6.

*Primary Examiner*—Stanley T. Krawczewicz
*Attorney, Agent, or Firm*—Paul J. Winters; Michael J. Pollock; Warren M. Becker

[57] ABSTRACT

A printed circuit board test fixture having interchangeable top plates (card personalizers). The test fixture is provided with a vacuum well having a field of probes mounted therein. The field of probes corresponds to the sum of all test points of a family of different printed circuit boards. Only a portion of all the probes are necessary to test any particular type of circuit board of the family. The top plate for each type of circuit board in the family has holes drilled completely therethrough only at locations where selected probes must pass through the top plate in order to contact the test points on the circuit board. In a preferred form, each top plate is partially drilled therethrough to form sockets at locations corresponding to the remaining probes which need not contact a particular circuit board. A hinged cover is provided for the vacuum well to allow easy removal and insertion of top plates.

13 Claims, 5 Drawing Figures

PRINTED CIRCUIT BOARD TEST FIXTURE HAVING INTERCHANGEABLE CARD PERSONALIZERS

CROSS REFERENCES TO RELATED APPLICATIONS

This application is a continuation of U.S. patent application Ser. No. 031,432, filed Apr. 19, 1979, now abandoned.

BACKGROUND OF THE INVENTION

1. Field of the Invention

This invention relates to test fixtures for use in systems designed to test printed circuit boards. These test fixtures function to electrically connect the test points on the printed circuit board under test to the test system.

2. Description of the Prior Art

In printed circuit board test systems as heretofore known, a single test fixture was provided for testing a single type of printed circuit board. Accordingly, in order to test printed circuit boards of X different types, then X different test fixtures would need to be provided.

It can be appreciated that one who needs to test many different types of circuit boards would need to own and store many different test fixtures. This, in turn, would require a high capital outlay and the provision of suitable storage space for storing the many test fixtures. A substantial part of the expense arises from the fact that each test fixture must be provided with probes for contacting the test points on the printed circuit boards under test. These probes are relatively expensive because they are preferably spring loaded, and they must be very hard, corrosion resistant, and partially gold plated. These features are necessary to assure that each probe will be durable and will provide low contact resistance.

Thus, if we assume that the average number of probes on each of the X test fixtures is Y (which is equal to the average number of test points on each of the X printed circuit boards), then the total number of expensive probes needed for testing all X types of printed circuit boards is XY.

It would be advantageous to provide a universal printed circuit board test fixture which would utilize a single field of probes for testing many different types of printed circuit boards so as to minimize the number of expensive probes necessary for testing a multiplicity of boards. A further advantage of providing such test fixtures would be to minimize the number of separate test fixtures necessary for testing different types of boards.

It is an advantage of the present invention that it embodies only one relatively expensive field of probes to be used in testing any printed circuit board within a family of different boards.

In this context, a family of different printed circuit boards consists of several different, but related, types of boards. Each board type within a family has its own particular number of test points thereon, but the test points on one are generally arranged in a pattern which is similar to the pattern of another. Thus, in general, the set of locations of test points on one type of board in the family will be similar, but not identical to, the set of locations of test points on any other board in the family.

SUMMARY OF THE INVENTION

The invention is an improved printed circuit board test fixture having interchangeable top plates (card personalizers). The test fixture is provided with a vacuum well having a field of spring-loaded probes mounted therein. Each top plate is adapted to slide into and out of the vacuum well. A perimeter gasket is fastened to the top plate so as to effect a vacuum seal between it and the vacuum well. A cover is provided which is hingedly connected to the vacuum well and which, when closed, prevents the removal of the top plate from the vacuum well. The cover has a medial opening therein through which a printed circuit board may be placed on the top plate.

The field of probes in the vacuum well corresponds to the test points of a family of different printed circuit boards. To test any particular circuit board, only a portion of the total number of probes are needed to contact all the test points on the particular board.

For each printed circuit board in the family, there is associated therewith a personalized top plate. Each top plate has holes drilled completely therethrough only at locations corresponding to the locations of the selected probes which will contact the test points on the associated printed circuit board. Accordingly, the remaining probes which do not contact the printed circuit board will exert their forces on the top plate.

Opening the hinged cover allows the easy removal of a top plate and the insertion of another corresponding to another printed circuit board of the family.

BRIEF DESCRIPTION OF THE DRAWINGS

FIG. #1 is a perspective view of a product access unit embodying the invention.

FIG. #2 is a side view, partly in section, of a product access unit embodying the invention.

FIG. #3 is an enlarged cross-sectional view of a portion of a product access unit where the printed circuit board under test is not in contact with any probes.

FIG. #4 is an enlarged cross-sectional view of a portion of a product access unit showing a selected probe in contact with a test point and showing a remaining probe being prevented from contacting the printed circuit board under test.

Figure 2:
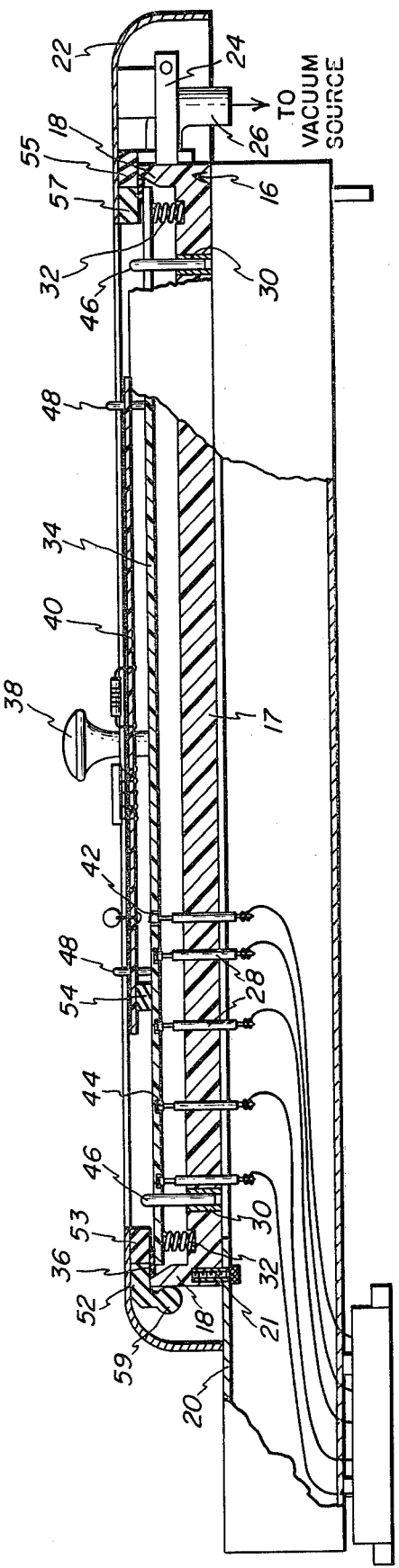
Figure 3:
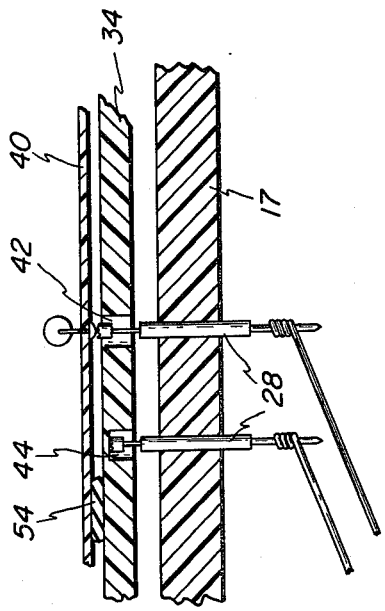
Figure 4:
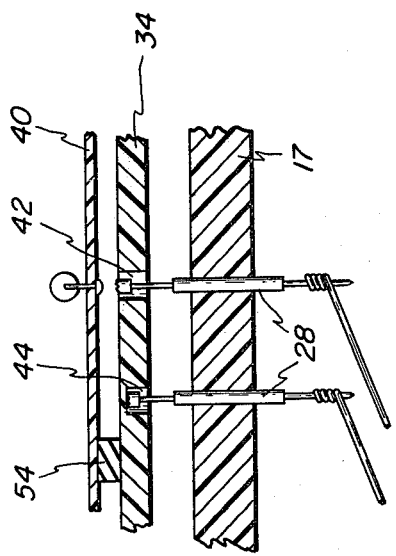

FIG. #5 is a cross-sectional view of a probe assembly employing a spring-loaded probe as in FIGS. 2, 3, and 4.

DESCRIPTION OF THE PREFERRED EMBODIMENTS

Figure 1:
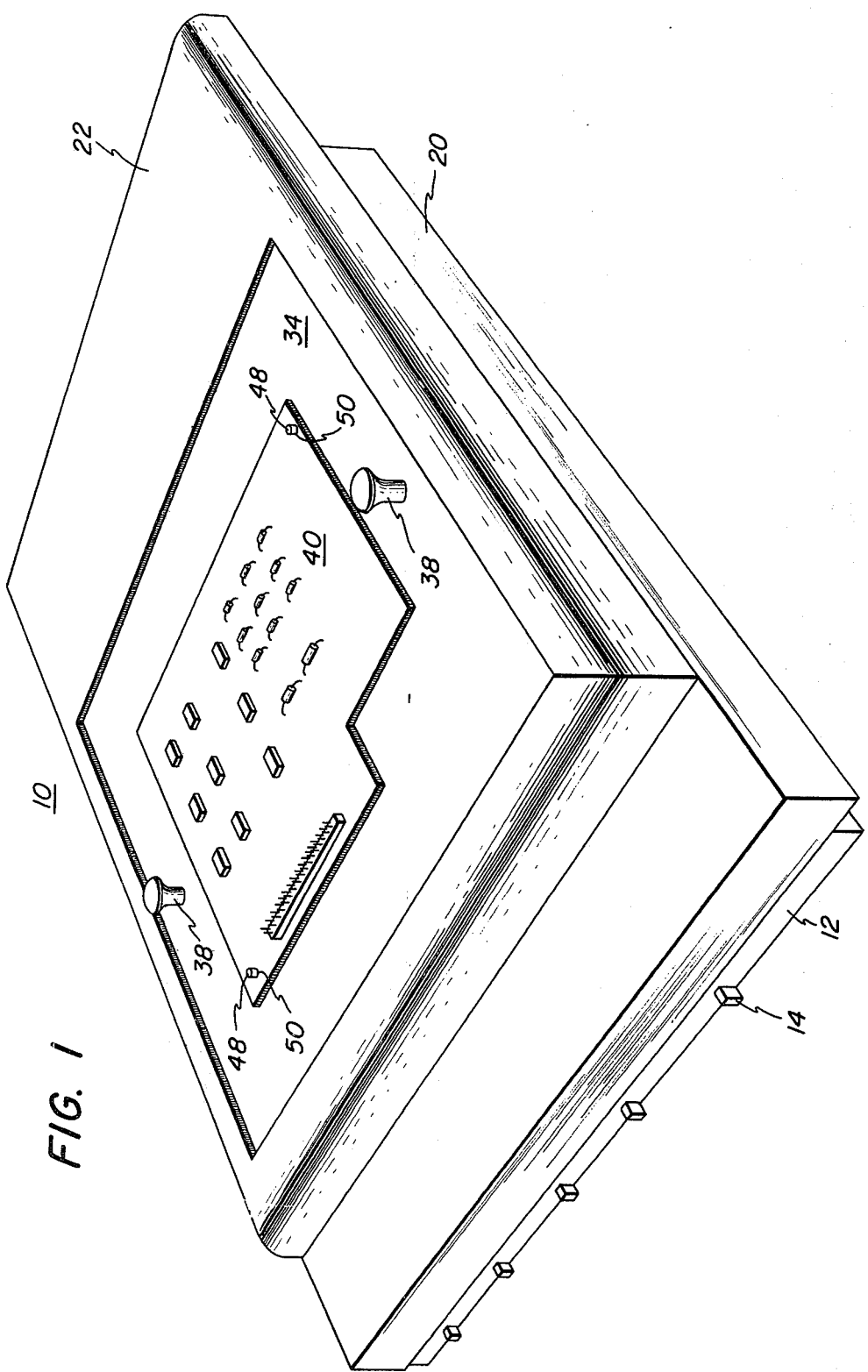

Referring now to FIG. 1, there is illustrated a product access unit 10 which includes a top plate 34 and a cover 22. Product access unit 10 is provided with contact panel 12 which has mating guides 14. Except as discussed below, product access unit 10 and the attached contact panel 12 are the same as those structures described in U.S. patent application Ser. No. 868,822, filed Jan. 12, 1978, now U.S. Pat. No. 4,230,985, "Interchangeable Printed Circuit Board Test Fixtures and a Receiver Therefor," Matrone et al., and whose contents are hereby incorporated by reference herein. As in the earlier application, product access unit 10 and contact panel 12 are adapted to mate with a receiver (not shown) in order to provide an electrical connection between the test probes contained in product access unit 10 and the test system (not shown).

Referring to FIG. 2, product access unit 10 includes a vacuum well 16 having a bottom wall 17 and side walls 18. Vacuum well 16 is fastened to the frame 20 of the product access unit 10 by socket head screws 21.

A cover 22 is provided for vacuum well 16 and is mounted thereon by hinges 24. One arm of each hinge 24 is fastened to the back side wall of vacuum well 16 by socket head screws (not shown) or other suitable means. The other arm of each hinge 24 is similarly fastened to cover 22. As can be seen clearly in FIG. 1, cover assembly 22 is provided with a medial opening through which the printed circuit board 40 under test can be placed upon the top plate (or card personalizer) 34.

Also attached to the back side wall of vacuum well 16 by screws or other suitable means is vacuum port 26 (FIG. 2). Vacuum port 26 communicates with the interior of vacuum well 16 by an opening (not shown) in the back side wall of vacuum well 16.

Still referring to FIG. 2, and more specifically to the bottom wall of vacuum well 16, it can be seen that one or more probes 28 are mounted therein. Probes 28 are all upfacing and substantially parallel to one another. In general, these probes 28 are set out in a pattern corresponding to the combined locations of test points on a family of different printed circuit boards. Thus, to test one type of printed circuit board in the family, only a portion of the probes 28 are needed to make contact therewith. Probes 28 are preferably of the spring-loaded type, pluggable into receptacles having wire wrap posts at their bases. The probe receptacles are rigidly mounted in bottom wall 17, making a vacuum-tight seal therewith.

FIG. 5 illustrates a typical probe assembly in which a cylindrical probe receptacle 29 narrows down at one end to receive a square wire wrap post 31. Probe 28 consists of a pin 33 having a crown contact tip 35 at one end, a cylindrical pin housing 37 into which pin 33 slideably fits, and a spring 39 which fits within pin housing 37 and contacts pin 33. Pin housing 37 fits into receptacle 29 down to where receptacle 29 narrows to receive post 31. Pin 33 has a necked portion 41 and pin housing 37 has a crimped portion 43 which together act to keep pin 33 from separating from housing 37. Not shown in FIG. 5 are various crimps which rigidly attach receptacle 29 to post 31 and housing 37.

Also mounted in the bottom wall 17 of vacuum well 16 are bushings 30. Bushings are preferably made of steel and they provide an opening which passes completely through the bottom wall 17. Bushings 30 function to accept dowel pins 46 so as to align the top plate 34 with vacuum well 16, as discussed further below.

One or more counterforce springs 32 are mounted in suitable recesses formed in the bottom wall 17 of vacuum well 16. Counterforce springs 32 serve to hold top plate 34 up against cover 22 while the well 16 is not evacuated. It has been found in most instances, however, that the upward forces exerted by unselected probes 28 against top plate 34 (as will be more fully described below) is sufficient for this purpose. In these instances, therefore, springs 32 can be omitted.

Referring to FIG. 1 and still referring to FIG. 2, top plate 34 is mounted within vacuum well 16. Top plate 34 is preferably made of General Electric grade G-10 epoxy glass cloth which is very resistant to warping under pressure. This material is also quite resistant to chipping during use or drilling. A perimeter gasket 36 which may be of any suitable gasket material is glued or otherwise attached to the top plate 34 so as to overhang it. Perimeter gasket 36 thus functions to effect a vacuum seal between the side walls 18 vacuum well 16 and top plate 34, while at the same time not requiring that top plate 34 or gasket 36 be fastened to the side walls of vacuum well 16. In this way, when cover 22 is opened (by rotating it on hinges 24) the top plate 34 may immediately be removed and another top plate 34 may be inserted into the vacuum well 16. To facilitate the handling of top plate 34, each top plate 34 is preferably provided with two knobs 38. Knobs 38 are fastened to top plate 34 by recessed screws or other suitable means.

The side walls 18 of vacuum well 16 are sloped inwardly as in U.S. Application Ser. No. 868,822. The perimeter gasket 36 cooperates with the sloping portion of side wall 18 in the same manner as described in that application to form a moving seal which is continuously effective during operation of the invention.

The printed circuit board 40 to be tested is mounted on the top plate 34 as shown in FIGS. 1 and 2. Each circuit board 40 may be placed on or removed from top plate 34 without opening cover 22 due to the medial opening in cover 22. Those skilled in the art will appreciate that the printed circuit board 40 to be tested is most often a "loaded" board, that is, one having electronic components, as illustrated, interconnected and mounted thereon in the configuration intended for the ultimate use of the board. Of course, the invention is equally useful in testing unloaded or so-called "bare" boards.

Top plate 34 is generally located between probes 28 and printed circuit board 40. Accordingly, probe holes 42 are drilled completely through top plate 34 at locations where it is desired that selected ones of probes 28 (hereafter generally referred to as the "selected" probes 28) pass through top plate 34 to come into contact with the test points on printed circuit board 40. Holes 42 are large enough to permit the space between circuit board 40 and top plate 34 to be evacuated, as will be more fully apparent hereinafter.

Since it is desired that the remaining ones of probes 28 (hereafter generally referred to as the "remaining" or "unselected" probes 28) not contact printed circuit board 40, top plate 34 is drilled only partially therethrough at the locations of the remaining probes 28 in order to provide probe sockets 44. The web of material remaining after probe sockets 44 are drilled is preferably between 15 and 20 mils thick. This web should be as thin as possible so that the remaining probes 28 (in contact with the web) are not depressed very much farther than the selected probes 28 (in contact with the printed circuit board 40) when the system is in operation (See FIG. 4). Since the total force on top plate 34, due to the unselected probes 28 making contact therewith, increases as the compression of unselected probes 28 increases, the provision of probe sockets 44 in top plate 34 reduces this total force. Since each unselected probe 28 exerts only approximately four (4) to eight (8) ounces of pressure on the web, the unselected probes 28 are incapable of punching through it, assuming material of sufficient strength is used for top plate 34.

Those skilled in the art will appreciate the advantages of the arrangement just described. By permitting only the selected probes 28 to come in contact with the circuit board 40 being tested (via holes 42) while preventing the remaining or unselected probes 28 from doing so (via sockets 44), a greater number of probes 28 per square inch can be used for a given amount of available vacuum force than would otherwise be the case. If, for example, the unselected or remaining probes 28 were not restrained by sockets 44, but permitted to exert their forces against circuit board 40 there would be a greater upward force exerted against the circuit board 40. With the arrangement just described for the preferred embodiment of this invention, the forces attributable to the remaining probes 28 are absorbed by top plate 34. These forces are, of course, counteracted by the downward forces due to atmospheric pressure exerted on the top plate in the area surrounding circuit board 40.

Another advantage in this arrangement is that it limits the forces exerted against the circuit board 40 to those attributable to only those selected probes 28 which are required for testing the board 40 in question. This is important because excessive forces can result in warping, cracking or other damage to circuit board 40.

In order to maintain alignment between the pattern of probes 28 and the pattern of probe holes 42 and probe sockets 44, top plate 34 is provided with dowel pins 46. Dowel pins 46 are rigidly mounted in top plate 34 by any suitable means and they are adapted to slideably fit into bushings 30 when top plate 34 is inserted into vacuum well 16. This combination of dowel pins 46 and bushings 30 allows top plate 34 to slide up and down within vacuum well 16 while restraining top plate 34 from moving in any lateral direction. Of course, the locations of dowel pins 46 and bushings 30 are selected such that the pattern of probes 28 will correspond to the pattern of probe holes 42 and probe sockets 44.

In order to assure that the test points of printed circuit board 40 are in alignment with probe holes 42, top plate 34 is provided with at least two guide pins 48 rigidly mounted thereon in any suitable manner (See FIG. 1). At the same time, each printed circuit board 40 is provided with guide pin holes 50 in suitable locations such that the locations of the test points will correspond to the locations of probe holes 42 when guide pins 48 are inserted into guide pin holes 50.

Referring more particularly to FIG. 2, it can be seen that in its normal state, top plate 34 is held suspended above the bottom wall of vacuum well 16 by counterforce springs 32 and those remaining probes 28 which are at locations corresponding to the locations of probe sockets 44. In this condition, the selected probes 28 which are at locations corresponding to the locations of probe holes 42 are not in electrical contact with the test points of printed circuit board 40. A vacuum source (not shown) is provided which communicates with the interior of vacuum well 16 via vacuum port 26 to pull top plate 34 and printed circuit board 40 into vacuum well 16 so as to bring the test points into contact with the selected probes 28. Although a vacuum means is preferred, any suitable means for bringing the test points into contact with the selected probes 28 may be used.

As mentioned before, a vacuum seal is provided between the side walls of vacuum well 16 and top plate 34 by virtue of perimeter gasket 36 which is fastened to top plate 34. An additional seal is provided along this junction when the cover 22 is in its closed position, by vacuum gaskets 52, 53, 55 and 57 which are glued or otherwise suitably fastened to the interior of cover assembly 22. When closed, cover 22 and vacuum gaskets 52, 53, 55 and 57 seat flush against the top of the side walls 18 of vacuum well 16 and against the top of perimeter gasket 36. While gaskets 52, 53, 55 and 57 are visible in FIG. 2 for the front and back ends only of cover 22, it should be understood that similar gasketing is also provided along the remaining two sides of cover 22. As illustrated in FIG. 2, gasket 52 along the front side of cover 22 terminates in an enlarged portion 59 which presses against the outer surface of side wall 18. The gasketing along the two sides is the same. This arrangement effectively seals the vacuum chamber to the atmosphere when the top plate is in the "start" or "up" position.

At the junction between top plate 34 and printed circuit board 40, top plate 34 is provided with edge gasket 54 for effecting a vacuum seal therebetween (See FIGS. 2, 3 and 4). Dowel pins 46 are snuggly fit into bushings 30 such that there is little, if any, vacuum leakage.

FIGS. 3 and 4 illustrate top plate 34 and printed circuit board 40 before and after vacuum well 16 has been evacuated. In FIG. 3, it can be seen that absent a vacuum, neither of the two probes 28 is in contact with the test point shown in printed circuit board 40. However, in FIG. 4, where the vacuum well 16 has been evacuated, top plate 34 and printed circuit board 40 are pressed down into vacuum well 16. At the location of probe hole 42, the selected probe 28 comes into contact with the test point. At the location of probe socket 44, the remaining probe 28 is blocked by top plate 34 and, therefore, cannot come into contact with printed circuit board 40.

To test a number of identical boards, the operator first installs the appropriate top plate 34 having holes 42 at the required test points. Cover 22 is closed and the first circuit board 40 is aligned on guide pins 48. The interior of well 16 is then evacuated, causing plate 34 and board 40 to be drawn down, as illustrated in FIG. 4, bringing test points on board 40 into contact with selected probes 28 at locations where holes 42 have been provided in plate 34. Upon completion of the test, the vacuum source is disconnected and plate 34 and board 40 return to their upper position, as in FIGS. 2 and 3. Board 40 is then replaced by another identical board to be tested and the process is repeated.

To test a different board in a family, a different top plate is used, namely, the one appropriate for that board, and the same process is repeated.

The description above is of the preferred embodiment of the invention. Various changes and modifications will occur to those with ordinary skill in the art, and it is intended that such changes and modifications be included within the spirit and scope of the invention as claimed below.

What is claimed is:

1. A universal fixture system for printed circuit board testing comprising:
   a well having side walls and a substantially flat bottom wall;
   an array of test probes selectively sufficient for testing each printed circuit board in a family comprising a plurality of different types of printed circuit boards, each test probe mounted through the bottom wall generally perpendicular to it;
   a top plate slideably mounted in the well for movement generally perpendicular to the bottom wall, the mounted top plate being one of a like plurality of interchangeable personalized top plates corresponding on a one-to-one basis to the different types of boards, each other top plate slideably mountable in the well in the same manner as the mounted top plate, each top plate having holes formed through it at locations corresponding on a one-to-one basis both to test points on the corresponding type of board and to selected probes of the test probes, and at least one but not all of the selected probes for one of the top plates being identical to at least one of the selected probes for another of the top plates;

means for securing the mounted top plate at its top side to any particular board under test of the corresponding type of board; and means for moving the mounted top plate and the particular board toward the test probes to cause each selected probe for the mounted top plate to contact the corresponding test point of the particular board.

2. A universal fixture system as in claim 1 wherein each test probe is spring loaded so as to be compressible in a direction generally perpendicular to the bottom wall.

3. A universal fixture system as in claim 2 wherein the mounted top plate has probe sockets passing from its bottom side only partially through it at locations corresponding to the remaining probes of the test probes and wherein the probe sockets receive the remaining probes as they compress to prevent them from contacting the particular board when the mounted top plate and the particular board move toward the test probes.

4. A universal fixture system as in claim 3 wherein the well is a vacuum well.

5. A universal fixture system as in claim 4 and further including an edge gasket for effecting a vacuum seal between the board under test and its corresponding top plate, a perimeter gasket for effecting a vacuum seal between the side walls and the corresponding top plate, and a vacuum port for evacuating the well.

6. A universal fixture system as in claim 5 and further including a cover assembly hingeably connected to the well for movement between an open position and a closed position, each top plate (1) placeable in the well when the cover assembly is in the open position and (2) held in the well when the cover assembly is in the closed position.

7. A universal fixture system as in claim 4 wherein the cover assembly (1) includes at least one vacuum gasket for effecting an additional vacuum seal between the side walls and the perimeter gasket when the cover assembly is in the closed position and (2) has an opening therethrough through which the board under test can be placed upon its corresponding top plate.

8. A universal fixture system as in claim 1 or 7 wherein each top plate is made of epoxy glass cloth.

9. A universal fixture system as in claim 8 wherein the material thickness from the deepest point of each probe socket on one side of each top plate to the other side of the top plate is in the range of fifteen to twenty mils.

10. A printed circuit board test fixture which has a supporting structure having a first plate, a field of test probes mounted through the first plate generally perpendicular to it, a second plate movably mounted in the supporting structure for movement generally perpendicular to the first plate, means for securing a particular printed circuit board under test to the mounted second plate at its side furthest from the first plate, and means for bringing the mounted second plate and the field of test probes toward each other, characterized in that the test probes are selectively sufficient for testing each board in a family comprising a plurality of different types of printed circuit boards, the mounted second plate is one of a like plurality of interchangeable personalized second plates corresponding on a one-to-one basis to the types of boards, each other second plate is movably mountable in the supporting structure in the same manner as the mounted second plate, each second plate has holes formed through it at locations corresponding both to test points on the corresponding type of board and to selected probes of the test probes, at least one but not all of the selected probes for one of the second plates is common to the selected probes for another of the second plates, the particular board is one of the types of boards, and the selected probes for the mounted second plate contact test points of the particular board when the mounted second plate and the field of test probes come toward each other.

11. A test fixture as in claim 10 further characterized in that each test probe is spring loaded so as to be compressible in a direction generally perpendicular to the first plate, the mounted second plate has probe sockets passing only partially through it from its side nearest the first plate at locations corresponding to the remaining probes of the test probes, and the probe sockets receive the remaining probes as they compress to prevent them from contacting the particular board when the mounted second plate and the field of test probes come toward each other.

12. A test fixture as in claim 10 or 11 characterized in that the area of the first plate generally enclosed by the selected probes for one of the second plates at least partially overlaps the area of the first plate generally enclosed by the selected probes for another of the second plates.

13. A test fixture as in claim 10 or 11 characterized in that the areas projected on the first plate generally enclosed by the selected probes for one second plate when mounted in the supporting structure and by the selected probes for another second plate when mounted in the supporting structure generally overlap each other.

* * * * *